United States Patent
Kuroki

(10) Patent No.: US 7,050,350 B2
(45) Date of Patent: May 23, 2006

(54) FIELD MEMORY HAVING A LINE MEMORY IN A MEMORY CELL ARRAY

(75) Inventor: Osamu Kuroki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 216 days.

(21) Appl. No.: 10/465,696

(22) Filed: Jun. 20, 2003

(65) Prior Publication Data

US 2004/0104914 A1   Jun. 3, 2004

(30) Foreign Application Priority Data

Nov. 29, 2002 (JP) ............................. 2002-347031

(51) Int. Cl.
  *G11C 8/00* (2006.01)
(52) U.S. Cl. ..................... 365/230.03; 365/230.06; 365/230.08
(58) Field of Classification Search ................ 345/503, 345/531, 536, 537, 543, 560, 564, 519, 530, 345/545; 365/189.01, 189.05, 230.01, 230.03, 365/230.06, 230.08
See application file for complete search history.

(56) References Cited

U.S. PATENT DOCUMENTS

| | | | | |
|---|---|---|---|---|
| 5,606,527 A | * | 2/1997 | Kwack et al. | 365/185.09 |
| 5,708,618 A | * | 1/1998 | Toda et al. | 365/230.05 |
| 5,978,303 A | * | 11/1999 | Takasugi et al. | 365/230.03 |
| 5,983,367 A | * | 11/1999 | Higuchi et al. | 365/230.03 |
| 6,333,889 B1 | * | 12/2001 | Arimoto | 365/230.03 |
| 6,445,632 B1 | * | 9/2002 | Sakamoto | 365/205 |
| 6,707,714 B1 | * | 3/2004 | Kawamura | 365/185.11 |
| 2001/0014046 A1 | * | 8/2001 | Sakamoto | 365/205 |
| 2003/0026163 A1 | * | 2/2003 | Toda et al. | 365/233 |

FOREIGN PATENT DOCUMENTS

JP  06-060699  3/1994
JP  06-176598  6/1994

* cited by examiner

*Primary Examiner*—Kee M. Tung
(74) *Attorney, Agent, or Firm*—Volentine Francos & Whitt, PLLC

(57) ABSTRACT

A field memory includes a memory cell array, a first decoder, a second decoder, a sense amplifier circuit, a transfer gate circuit, a write register and a read register. The memory cell array has a field memory for storing data and a line memory for temporarily storing data. The first decoder is coupled to the field memory for selecting a memory cell in the field memory. The second decoder is coupled to the line memory for selecting a memory cell in the line memory. The sense amplifier circuit is coupled to the, memory cell array. The transfer gate circuit is coupled to the sense amplifier circuit. The write register is coupled to the transfer gate circuit for temporarily storing data to be written in the memory cell array. The first read register is coupled to the transfer gate circuit for temporarily storing data read from the memory cell array.

17 Claims, 5 Drawing Sheets

FIELD MEMORY HAVING A LINE MEMORY IN A MEMORY CELL ARRAY

BACKGROUND OF THE INVENTION

The present invention relates to a field memory for storing screen display data corresponding to one screen for displaying the same on a display and particularly to data transfer thereof.

Enhanced-definition of a television or a video tape recorder has been advanced in recent years. A field memory for storing display data corresponding to one screen, and a line memory for storing display data corresponding to one line have been used to execute a noise removal process, etc.

Upon such a noise removal process using the field memory and the line memory, such a process as to store sequentially-inputted display data in the field memory and compare this data and previous data for each line is executed. Therefore, the previous display data is transferred to and saved into the line memory before writing of new display data into the field memory. Afterwards, new display data is written into a region for the corresponding line. Further, the display data written into the field memory and the display data saved into the line memory are read to perform the noise removal process or the like.

Since, however, the field memory and the line memory are respectively independent of each other in the conventional noise removal process, a problem arises in that the time required to transfer data from the field memory to the line memory is taken and a packaging area and cost increase.

SUMMARY OF THE INVENTION

The present invention may provides a field memory capable of shortening a data transfer time and reducing a packaging area and cost owing to integration of the field memory and a line memory.

The present invention provides a field memory including a memory cell array, a first decoder, a second decoder, a sense amplifier circuit, a transfer gate circuit, a write register and a read register. The memory cell array has a field memory for storing data and a line memory for temporally storing data. The first decoder is coupled to the field memory for selecting memory cell in the field memory. The second decoder is coupled to the line memory for selecting memory cell in the line memory. The sense amplifier circuit is coupled to the memory cell array. The transfer gate circuit is coupled to the sense amplifier circuit. The write register is coupled to the transfer gate circuit for temporally storing data to be written in the memory cell array. The first read register is coupled to the transfer gate circuit for temporally storing data read from the memory cell array.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
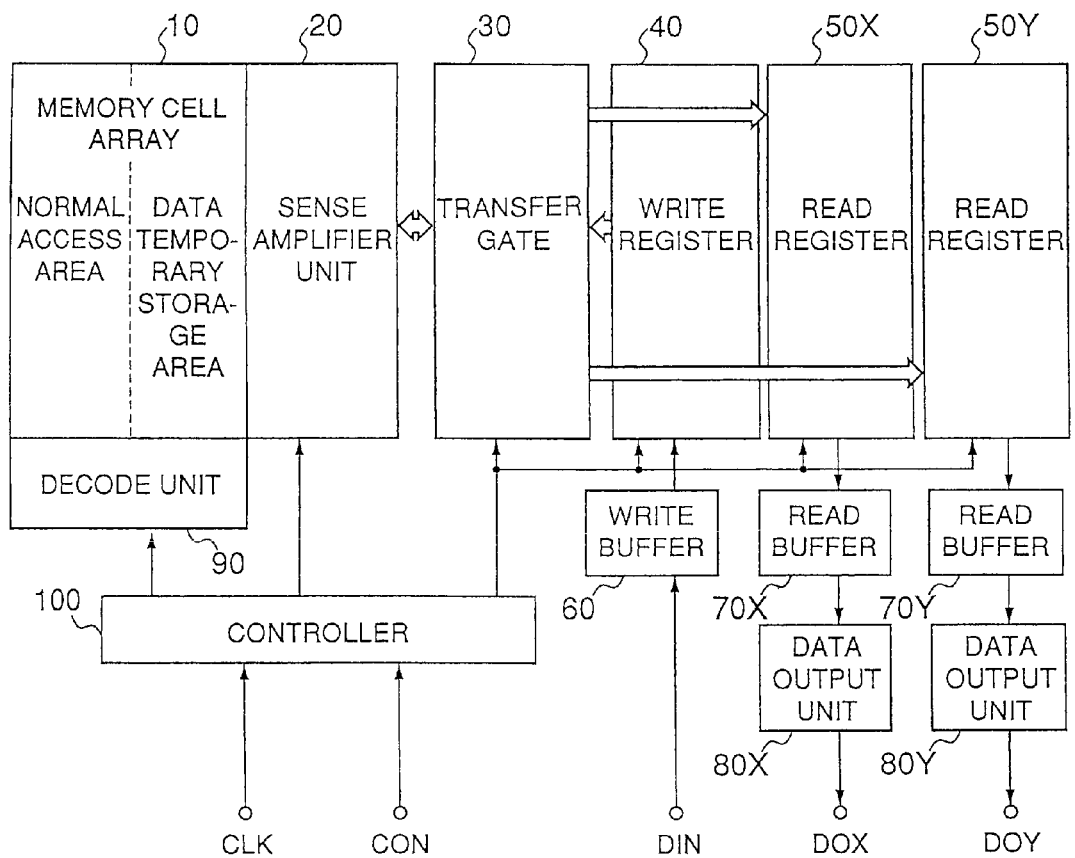
FIG. 1 is a basic configuration diagram of a field memory showing a first embodiment of the present invention.

FIG. 1 is a basic configuration diagram of a field memory showing a first embodiment of the present invention.

The field memory has a memory cell array 10 having a normal access area for storing therein display data corresponding to one screen, and a data temporary storage area for storing therein display data corresponding to one line.

A sense amplifier unit 20 for amplifying signals read from the respective areas and outputting the amplified signals therefrom, and performing writing into the respective areas is connected to the memory cell array 10. A write register 40 for storing write data corresponding to one line, and read registers 50X and 50Y for respectively storing read data corresponding to one line are connected to the sense amplifier unit 20 through a transfer gate 30.

The write register 40 temporarily holds write data into the normal access area of the memory cell array 10 and is supplied with external input data DIN through a write buffer 60. The read register 50X temporarily retains data read from the normal access area of the memory cell array 10 and outputs the retained data from a read amplifier 70X to the outside through a data output unit 80X as output data DOX. On the other hand, the read register 50Y temporarily holds data read from the data temporary storage area of the memory cell array 10 and outputs the held data from a read amplifier 70Y to the outside through a data output unit 80Y as output data DOY.

Further, the field memory includes a decode unit 90 for selecting the corresponding access area with respect to the memory cell array 10, and a control unit or controller 100 for controlling the transfer of data between the memory cell array 10 and the respective registers 40, 50X and 50Y based on a clock signal CLK and a control signal CON supplied from outside, etc.

Figure 2:
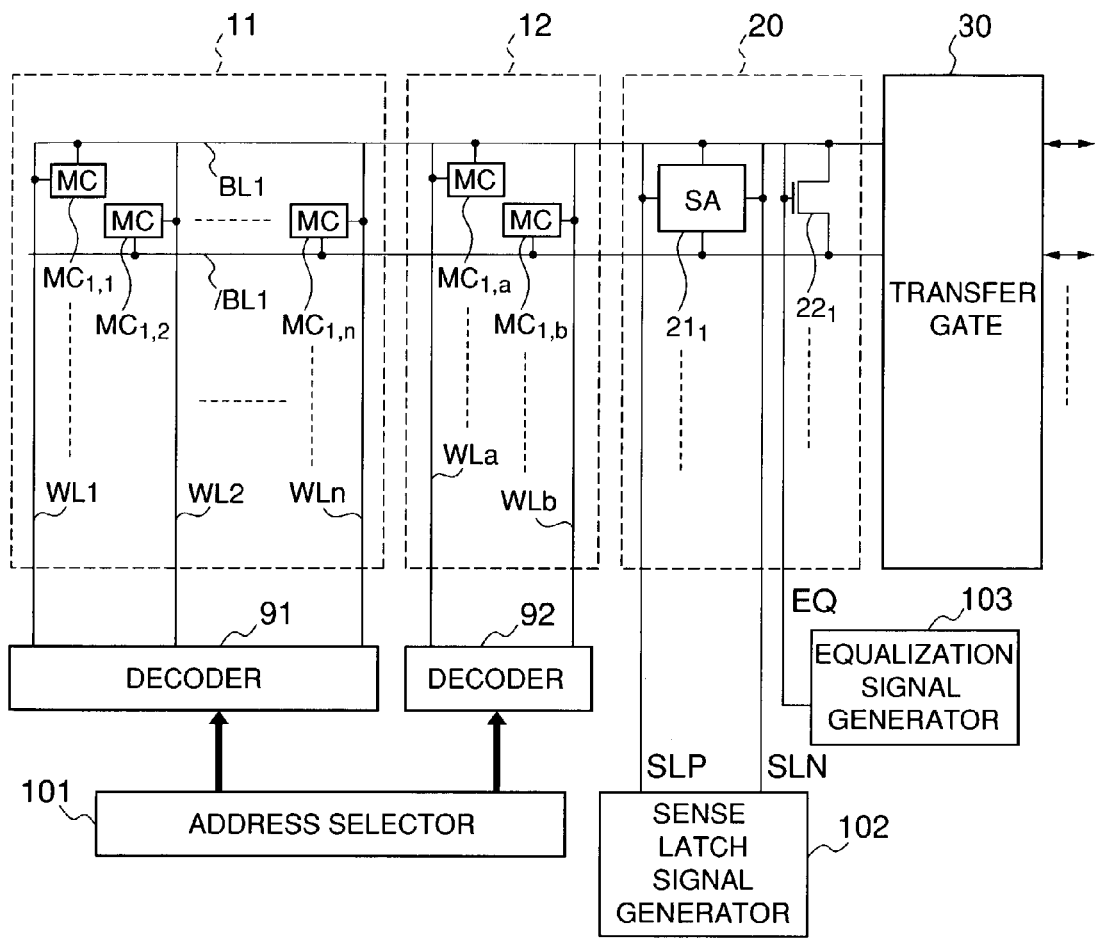
FIG. 2 is a configuration diagram of a principal portion of FIG. 1.

FIG. 2 is a configuration diagram of a principal portion of FIG. 1 and shows the details of the memory cell array 10, the sense amplifier unit 20, the decode unit 90 and the controller 100 for the basic configuration.

The memory cell array 10 comprises a field memory unit 11 corresponding to the normal access area for storing the display data corresponding to one screen, and a line memory unit 12 corresponding to the data temporary storage area for storing the display data corresponding to one line. A plurality of bit line pairs BLi, and /BLi (where i=1~m, and "/" means inversion) are disposed in parallel across the field memory unit 11 and the line memory unit 12. Incidentally, only the bit line pair BL1 and /BL1 are illustrated in the drawing for simplification of explanation.

In the field memory unit 11, n word lines WLj (where j=1~n) are disposed so as to cross the bit line pairs BLi and /BLi, and memory cells MCi,j are disposed at points where the respective bit line pairs BLi and /BLi and the word lines WLj intersect. In the line memory unit 12 on the other hand, two word lines WLa and WLb are disposed so as to intersect the bit line pairs BLi and /BLi, and memory cells MCi,a and MCi,b are respectively disposed at points where the respective bit line pairs BLi and /BLi and the word lines WLa and WLb intersect.

The sense amplifier unit 20 includes data read sense amplifiers (SA) 21$i$ provided in association with the respective bit line pairs BLi and /BLi, and bit-line equalizing MOS transistors 22$i$. The respective sense amplifiers 21$i$ are activated by common enable signals SLP and SLN to amplify signals on the respective bit line pairs BLi and /BLi to a predetermined level respectively. The respective MOS transistors 22$i$ are respectively turned on by a bit-line equalization signal WQ before data reading to set the respective bit line pairs BLi and /BLi to a predetermined level respectively.

The decode unit 90 comprises a decoder 91 for selectively driving the word lines WLi of the field memory unit 11, and a decoder 92 for selectively driving the word lines WLa and WLb of the line memory unit 12.

The controller 100 comprises an address selector 101 for controlling the decoders 91 and 92, a sense latch signal generator 102 for generating enable signals SLP and SLN for the sense amplifiers 21$i$, and an equalization signal generator 103 for generating a bit-line equalization signal EQ for the MOS transistors 22$i$.

Figure 3:
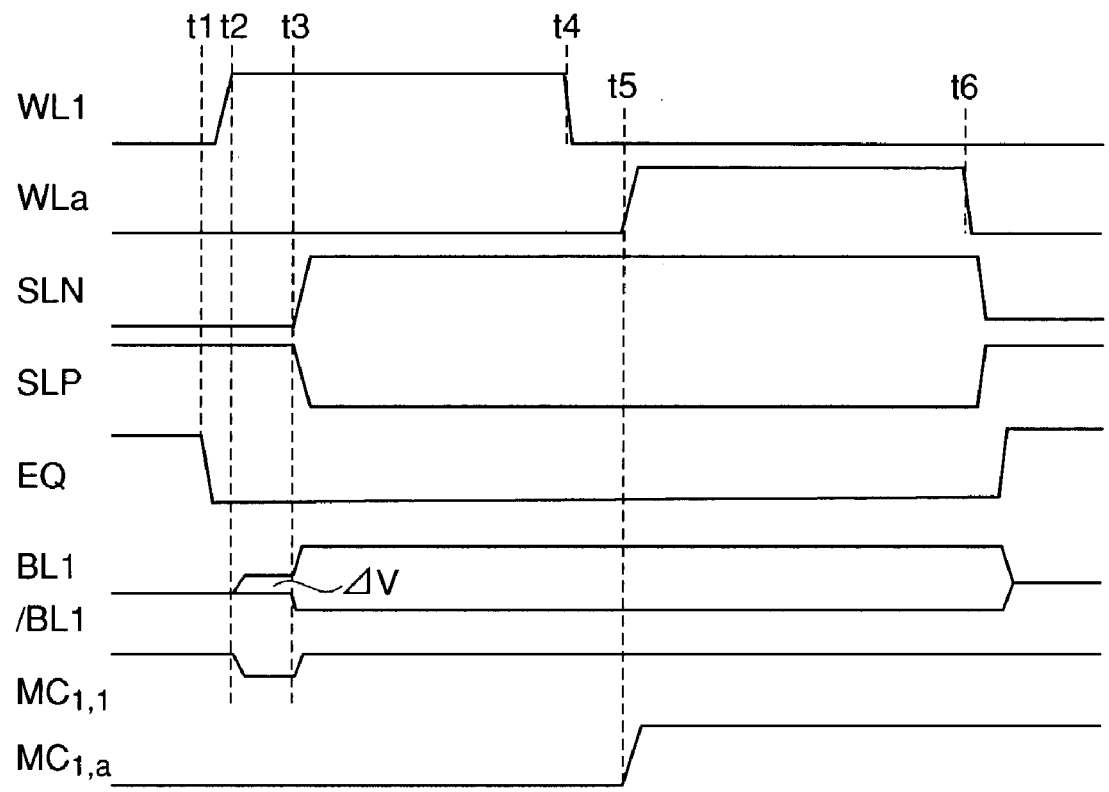
FIG. 3 is a signal waveform diagram showing the operation of FIG. 2.

FIG. 3 is a signal waveform diagram showing the operation of FIG. 2. The operation of FIG. 2 will be described below with reference to FIG. 3.

Now assume that a storage node of a memory cell MC1,1 of the field memory unit 11 is charged to an "H", and a storage node of a memory cell MC1,a of the line memory unit 12 is charged to an "L", respectively.

At a time t1 of FIG. 3, a bit-line equalization signal EQ outputted from the equalization signal generator 103 is taken "L", so that all the bit line pairs BLi and /BLi are respectively brought to a floating state.

At a time t2, a word line WL1 is selected and driven by the decoder 91 under the control of the address selector 101, so that it is taken "H". Thus, a signal at the storage node of the memory cell MC1,1 connected to the word line WL1 is outputted to its corresponding bit line BL1, so that a small potential difference of ΔV is developed between the bit line pair BL1 and /BL1.

At a time t3, enable signals SLP and SLN outputted from the sense latch signal generator 102 are respectively taken "H" and "L" so that the corresponding sense amplifier 21$_1$ is activated. Thus, signals on the bit line pair BL1 and /BL1 are amplified up to a normal logical level, so that the bit line BL1 is taken "H" and the bit line /BL1 is taken "L".

At a time t4, the output sent from the decoder 91 is stopped so that the word line WL1 is taken "L", thus leading to the completion of reading of the memory cell MC1,1. At this time, the bit-line equalization signal EQ and enable signals SLP and SLN are held in the as-is state. Consequently, a signal outputted from the sense amplifier 21$_1$ is outputted to the bit line pair BL1 and /BL1 continuously as it is.

At a time t5, the word line WLa is selected and driven by the decoder 92 under the control of the address selector 101, so that it is taken "H". Thus, the storage node of the memory cell MC1,a connected to the word line WLa is connected to its corresponding bit line BL1. Since, at this time, signals each having a normal logical level are outputted from the sense amplifier 21$_1$ to the bit line pair BL1 and /BL1, the storage node of the memory cell MC1,a is charged to an "H" regardless of the electrical charge, which has been charged in the memory cell MC1,a. Consequently, the memory cell MC1,a is rewritten by the data of the memory cell MC1,1.

At a time t6, the word line WLa is returned to the "L", and hence the memory cell MC1,a is disconnected from the bit line BL1. The enable signals SLP and SLN are respectively taken "L" and "H" so that the sense amplifier 21$_1$ is deactivated. Further, the bit-line equalization signal EQ is taken "H" and hence the levels of all the bit line pairs BLi and /BLi are equalized in preparation for the following read operation.

While the above description has been made of the operation at the time that the data of the memory cell MC1,1 is taken "H", the memory cell MC1,a is rewritten so as to be taken "L" by a similar operation even where the data of the memory cell MC1,1 is taken "L". Although only the bit line pair BL1 and /BL1 is shown in FIG. 2, similar operations are actually performed simultaneously at m pairs of bit line pairs BLi and /BLi.

In the field memory according to the first embodiment as described above, the memory cell MC1,a of the line memory unit 12 is provided on the corresponding bit line pair BLi and /BLi of the field memory unit 11. Thus, wiring into the line memory 12 is performed following the reading of the field memory 11 to thereby enable the transfer of data from the field memory unit to the line memory unit in one-line units.

Thus, the previous data is transferred to the line memory unit 12, and new data are then written into the same addresses of the field memory unit 11 and transferred to their corresponding different read registers (read registers 50X and 50Y in FIG. 1), whereby the new and previous data at the same addresses can be read simultaneously.

Accordingly, independent line memories for holding and outputting data corresponding to one line become unnecessary, a layout area is reduced and control on the field memory becomes easy. Further, the transfer of data corresponding to one line needs a time interval corresponding to the number of bits per line×cycle time even when the independent line memories are used. According to the present field memory, however, an advantage is brought about in that since the transfer of data corresponding to one line is completed in a once-operating time of each word line, the time required for the data transfer can be shortened.

Figure 4:
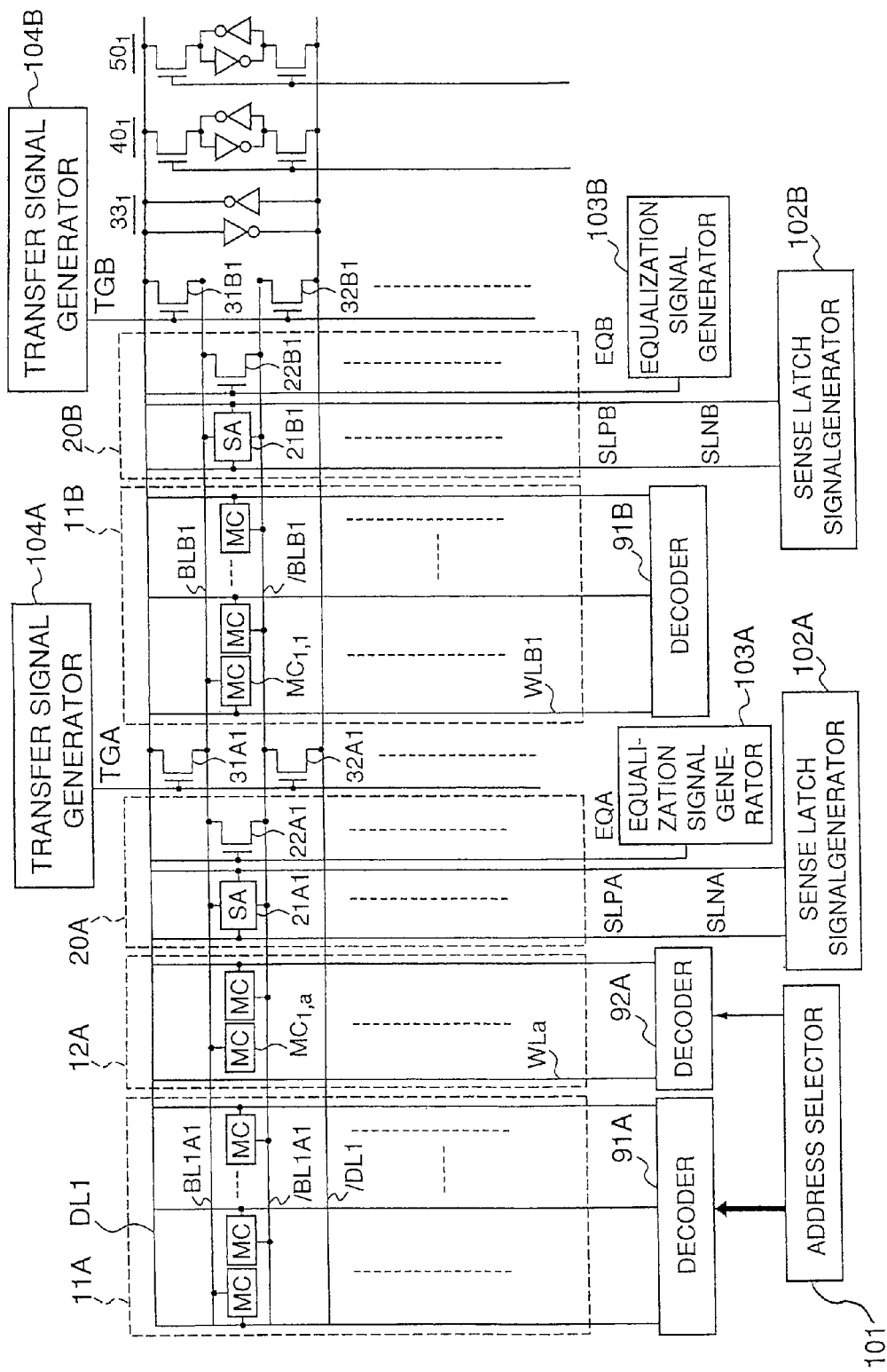
FIG. 4 is a configuration diagram of a field memory illustrating a second embodiment of the present invention.

FIG. 4 is a configuration diagram of a field memory showing a second embodiment of the present invention. Elements common to those shown in FIG. 2 are respectively identified by common reference numerals.

The field memory is one wherein memory cell arrays each having a basic configuration are provided in the form of plural blocks, and data temporary storage areas are provided in the respective one blocks thereof.

In a manner similar to the field memory shown in FIG. 2, the present field memory includes, as a memory block A, a field memory unit 11A, a line memory unit 12A, a sense amplifier unit 20A, decoders 91A and 92A, a sense latch signal generator 102A, and an equalization signal generator 103A. Further, the field memory has, as a memory block B, a field memory unit 11B, a sense amplifier unit 20B, a decoder 91B, a sense latch signal generator 102B, and an equalization signal generator 103B. The difference between the memory blocks A and B resides in the presence or absence of the line memory unit and the decoder corresponding to it. They are identical to each other in other configurations.

Further, the field memory has data transfer data line pairs DLi and /DLi provided in association with respective bit line pairs to connect the memory blocks A and B in common. The data line pairs DLi and /DLi and the respective bit line pairs BLAi and /BLAi of the memory block A are respectively connected via MOS transistors 31Ai and 32Ai of a transfer gate and on/off-controlled by a transfer control signal TGA outputted from a transfer signal generator 104A.

The data line pairs DLi and /DLi and the respective bit line pairs BLBi and /BLBi of the memory block B are respectively connected via MOS transistors 31Bi and 32Bi of a transfer gate 30 and on/off-controlled by a transfer control signal TGB outputted from a transfer signal generator 104B.

Transfer registers 33i are respectively connected to the data line pairs DLi and /DLi, and write registers 40i and read registers 50i are respectively connected thereto via transfer transistors. Incidentally, the dimensions of the transfer registers 33i are set sufficiently small as compared with sense amplifiers in such a manner that the operations of the sense amplifiers are not affected by the transfer registers 33i.

Figure 5:
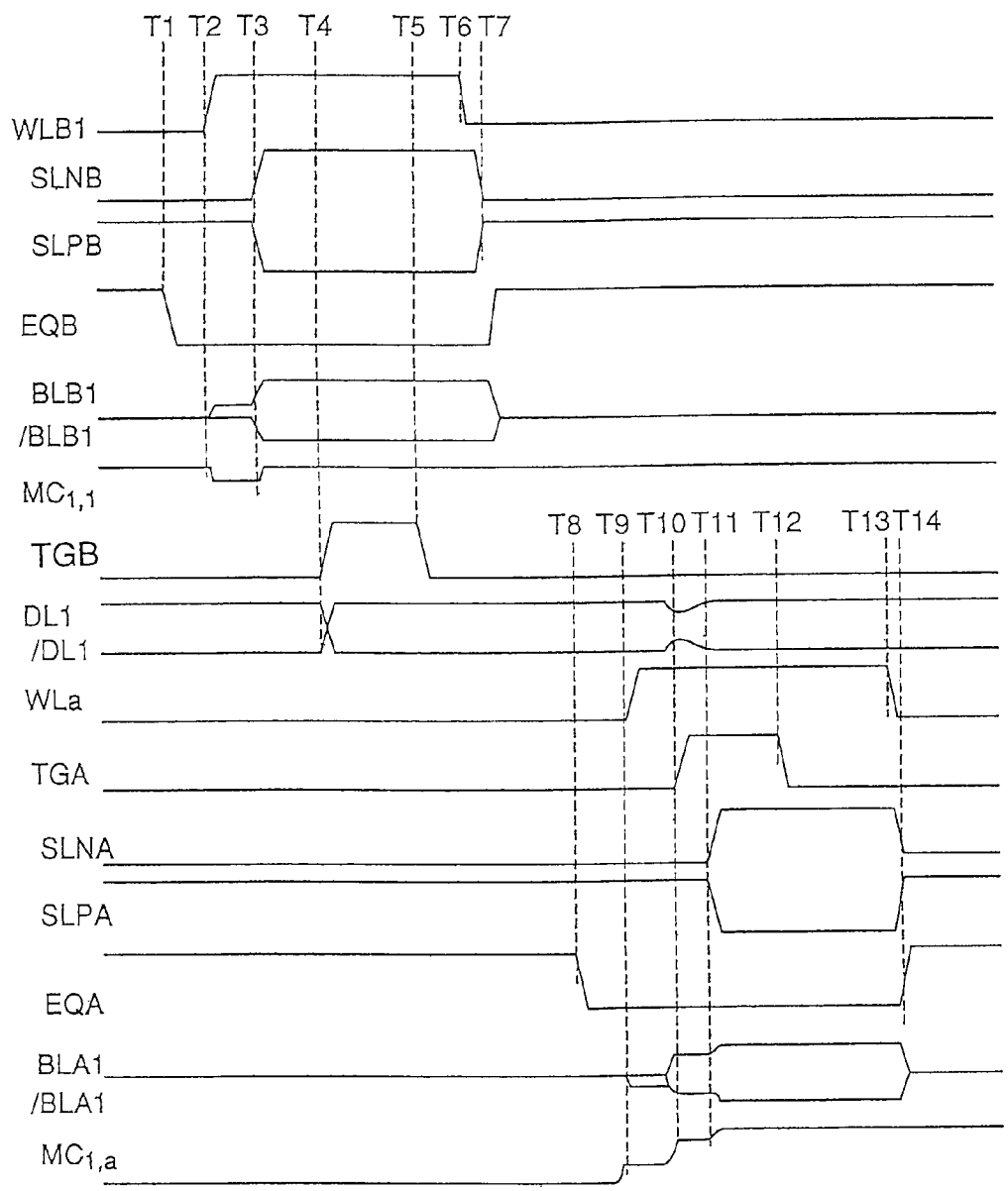
FIG. 5 is a signal waveform diagram showing the operation of FIG. 4.

FIG. 5 is a signal waveform diagram showing the operation of FIG. 4. The operation of FIG. 4 will be described below with reference to FIG. 5.

Now assume that a storage node of a memory cell MC1,1 of the field memory unit 11B is charged to an "H", and a storage node of a memory cell MC1,a of the line memory unit 12A is charged to an "L", respectively.

At a time T1 of FIG. 5, a bit-line equalization signal EQB outputted from the equalization signal generator 103B of the memory block B is first taken "L". At a time T2, a word line WLB1 is selected by the decoder 91B under the control of an address selector 101. A signal at the storage node of the memory cell MC1,1 connected to the word line WLB1 is outputted to its corresponding bit line BLB1. At a time T3, a sense amplifier 21B1 is operated by enable signals SLPB and SLNB outputted from the sense latch signal generator 102B so that the bit line BLB1 is taken "H" and its corresponding bit line /BLB1 is taken "L". The operation described until now is similar to the first embodiment.

At a time T4, the transfer control signal TGB outputted from the transfer signal generator 104B is taken "H" so that the bit line pair BLB1 and /BLB1 are respectively connected via their corresponding MOS transistors 31A1 and 32A1 to data transfer data line pairs DL1 and /DL1. Thus, a data line DL1 is taken "H" and a data line /DL1 is taken "L". A state of the data line pair DL1 and /DL1 is retained in its corresponding transfer register 33₁.

While the transfer control signal TGB goes "L" at a time T5, the data retained in the transfer register 33₁ is maintained as it is.

At a time T6, the output produced from the decoder 91B is stopped so that the word line WLB1 is taken "L". Further, at a time T7, the enable signals SLPB and SLNB are respectively taken "L" and "H", and the bit-line equalization signal EQB is taken "H", so that the levels of all the bit line pairs BLBi and /BLBi in the memory block B are equalized in preparation for the following read operation. Consequently, the reading of data from the field memory unit 11B of the memory block B is completed.

Next, at a time T8, a bit-line equalization signal EQA outputted from the equalization signal generator 103A of the memory block A is taken "L", so that all the bit line pairs BLAi and /BLAi in the memory block A are respectively brought to a floating state.

At a time T9, a word line WLa is selected and driven by the decoder 92A under the control of the address selector 101 so that it is taken "H". Thus, a signal at the storage node of the memory cell MC1,a connected to the word line WLa is outputted to its corresponding bit line BLA1, whereby a small potential difference is developed between the bit line pair BLA1 and /BLA1.

At a time T10, the transfer control signal TGA outputted from the transfer signal generator 104A is taken "H" so that the bit line pair BLA1 and /BLA1 is connected to the corresponding data line pair DL1 and /DL1 via the MOS transistors 31A1 and 32A1. Thus, the levels of the data line pair DL1 and /DL1 are outputted to the bit line pair BLA1 and /BLA1 regardless of the electrical charge charged in the memory cell MC1,a.

At a time T11, enable signals SLPA and SLNA outputted from the sense latch signal generator 102A are respectively taken "H" and "L" so that a sense amplifier 21A1 is activated to amplify the signals on the bit line pair BLA1 and /BLA1 to a normal logical level respectively. Consequently, the memory cell MC1,a of the line memory unit 12a is rewritten by data of the memory cell MC1,1 of the field memory unit 11B in the memory block B.

Further, the transfer control signal TGA goes "L" at a time T12, and the output from the decoder 92A is stopped so that the word line WLa is taken "L" at a time T13. At a time T14, the enable signals SLPA and SLNA are respectively taken "L" and "H" and the bit-line equalization signal EQA goes "H", whereby the levels of all the bit line pairs BLAi and /BLAi in the memory block A are equalized in preparation for the next read operation. Consequently, the writing of data into the line memory unit 12A of the memory block A is completed.

As described above, the field memory according to the second embodiment is provided with the data line pairs DLi and /DLi common to the two memory blocks A and B and the transfer registers 33i for holding data on the data line pairs DLi and /DLi. It is thus possible to, for example, cause the transfer register 33i to retain the data read from the field memory unit 11B of the memory block B via the data line pairs DLi and /DLi and write the same into the line memory unit 12A of the memory block A.

Thus, even when the field memory is large in memory capacity and divided into a plurality of memory cell arrays, an advantage similar to the first embodiment is obtained owing to the provision of the data temporary storage area in one of the divided memory cell arrays.

Incidentally, the present invention is not limited to the illustrated embodiments, and various modifications can be made thereto. The following are taken for instance as such modifications.

While the field memory shown in FIG. 4 is equipped with the write registers 40i and the read registers 50i in addition to the transfer register 33i, the transfer registers 33i are deleted and the field memory can share the use of the read registers 50i instead. Consequently, circuit simplification is enabled. In such a case, however, there is a need to on/off-control the transfer transistors according to the execution of a read operation and the operation of data transfer.

While the field memory shown in FIG. 4 has the two memory blocks A and B, a field memory having three or more memory blocks can be also applied in the same manner.

While the field memory shown in FIG. 4 is configured such that the line memory unit 12A is provided in the memory block A, the line memory unit 12A is separated from the memory block A and configured in a manner similar to the memory block B, and a plurality of basic memory blocks and one line memory unit may be configured so as to be connected by the data lines DLi and /DLi.

According to the present invention as described above in detail, a first memory cell for storing data corresponding to one screen of a field memory unit, and a second memory cell for storing data corresponding to one line of a line memory unit are provided on the same bit lines. There is further provided a sense amplifier unit for amplifying signals on the bit lines to a predetermined logical level. It is thus possible to select a first word line and read data corresponding to one line into the corresponding bit lines, and select a second word line and collectively transfer the data on the bit lines to the second memory cell. Accordingly, a packaging area can be reduced and a data transfer time interval can be shorted in a simple configuration.

What is claimed is:

1. A semiconductor memory device comprising:
   a memory cell array having a plurality of memory cells, the memory cell array including a field memory for storing data, a line memory for temporarily storing data, and a plurality of bit lines connected to the field memory and the line memory so that the field memory and the line memory share the bit lines;
   a first decoder coupled to the field memory for selecting one of the memory cells in the field memory;
   a second decoder coupled to the line memory for selecting one of the memory cells in the line memory;
   a sense amplifier circuit coupled to the memory cell array through the bit lines, wherein the sense amplifier amplifies data that appears on the bit lines from the field memory so that the line memory stores the amplified data;
   a transfer gate circuit coupled to the sense amplifier circuit;
   a write register coupled to the transfer gate circuit for temporarily storing data to be written in the memory cell array; and
   a first read register coupled to the transfer gate circuit for temporarily storing data read from the memory cell array.

2. A semiconductor memory device according to claim 1, further comprising a second read register coupled to the transfer gate circuit for temporarily storing data read from the memory cell array.

3. A semiconductor memory device according to claim 1, wherein one of the memory cells in the field memory and one of the memory cells in the line memory are commonly connected to one of the bit lines.

4. A semiconductor memory device according to claim 3, wherein the sense amplifier circuit includes a plurality of sense amplifiers, and wherein one of the sense amplifiers is commonly connected to the one of the bit lines with the one of the memory cells in the field memory and the one of the memory cells in the line memory.

5. A semiconductor memory device according to claim 1, further comprising an address selection circuit coupled to the first and second decoders.

6. A semiconductor memory device according to claim 1, further comprising a control circuit coupled to the first and second decoders, the sense amplifier circuit, the transfer gate circuit, the write register and the first read register.

7. A semiconductor memory device comprising:
   a first memory cell array having a plurality of bit lines and a plurality of memory cells each of which is connected to one of the bit lines, the first memory cell array including a field memory for storing data and a line memory for temporarily storing data, wherein the field memory and the line memory share the bit lines;
   a first decoder connected to the field memory for selecting one of the memory cells in the field memory;
   a second decoder connected to the line memory for selecting one of the memory cells in the line memory;
   a first sense amplifier circuit connected to the first memory cell array through the bit lines, wherein the first sense amplifier amplifies data that appears on the bit lines from the field memory so that the line memory stores the amplified data;
   a first transfer gate circuit connected to the first sense amplifier circuit;
   a write register connected to the first transfer gate circuit for temporarily storing data to be written in the first memory cell array; and
   a first read register connected to the first transfer gate circuit for temporarily storing data read from the first memory cell array.

8. A semiconductor memory device according to claim 7, further comprising a second read register connected to the first transfer gate circuit for temporarily storing data read from the first memory cell array.

9. A semiconductor memory device according to claim 7, wherein one of the memory cells in the field memory and one of the memory cells in the line memory are commonly connected to one of the bit lines.

10. A semiconductor memory device according to claim 9, wherein the first sense amplifier circuit includes a plurality of sense amplifiers, and wherein one of the sense amplifiers is commonly connected to the one of the bit lines with the one of the memory cells in the field memory and the one of the memory cells in the line memory.

11. A semiconductor memory device according to claim 7, further comprising an address selection circuit connected to the first and second decoders.

12. A semiconductor memory device according to claim 7, further comprising a control circuit connected to the first and second decoders, the first sense amplifier circuit, the first transfer gate circuit, the write register and the first read register.

13. A semiconductor memory device according to claim 7, further comprising:
   a second memory cell array having a plurality of bit lines and a plurality of memory cells;
   a third decoder connected to the second memory cell array;
   a second sense amplifier circuit connected to the second memory cell array; and
   a second transfer gate circuit connected to the second sense amplifier circuit, the write register and the first read register.

14. A semiconductor memory device according to claim 13, wherein the first and second transfer gate circuits, the write register and the first read register are commonly connected to a data line.

15. A field memory comprising:
   a field memory unit including,
      a plurality of bit lines,
      a plurality of first word lines disposed so as to intersect the bit lines, and
      a plurality of first memory cells provided at respective intersecting points of the bit lines and the first word lines and storing data corresponding to one screen;

a line memory unit including,
- a plurality of second word lines disposed so as to intersect the bit lines, and
- a plurality of second memory cells provided at respective intersecting points of the bit lines and the second word lines and storing data corresponding to one line;

a sense amplifier circuit for amplifying signals on the bit lines to a predetermined logical level; and a controller for selecting a corresponding first word line and reading data of a first memory cell corresponding to the selected first word line onto a corresponding bit line, and selecting a corresponding second word line and writing the data on the corresponding bit line into a corresponding second memory cell.

16. A field memory comprising:

a first memory block having a first field memory unit for storing data corresponding to one screen, a line memory unit for storing data corresponding to one line, and a plurality of bit lines connected to the first field memory unit and the line memory unit so that the first field memory unit and the line memory unit share the bit lines;

a first sense amplifier circuit coupled to the first memory block through the bit lines, wherein the first sense amplifier amplifies data that appears on the bit lines from the first field memory unit so that the line memory unit stores the amplified data;

a second memory block having a second field memory unit for storing data corresponding to one screen;

a register for holding data corresponding to one line outputted from the first or second field memory unit to a data line; and a controller for reading the data corresponding to one line from the first or second field memory units and temporarily holding the data corresponding to one line in the register, and thereafter writing the data retained in the register into the line memory unit.

17. The field memory according to claim 16, wherein the first memory block includes, the first field memory unit having a plurality of first bit lines, a plurality of first screen word lines disposed so as to intersect the first bit lines, and first screen memory cells provided at respective intersecting points of the first bit lines and the first screen word lines and storing data corresponding to one screen, the line memory unit including line word lines disposed so as to intersect the first bit lines, and line memory cells provided at respective intersecting points of the first bit lines and the line word lines and storing data corresponding to one line, and a first transfer gate for connecting a corresponding first bit line to the data line according to a first transfer control signal, the second memory block includes, the second field memory unit having a plurality of second bit lines, a plurality of second screen word lines disposed so as to intersect the second bit lines, and second screen memory cells provided at respective intersecting points of the second bit lines and the second screen word lines and storing data corresponding to one screen, a second sense amplifier circuit for amplifying signals on the second bit lines to a predetermined logical level, and a second transfer gate for connecting a corresponding second bit line to the data line according to a second transfer control signal, wherein the controller selects first or second screen word lines and reads data corresponding to one line from first or second screen memory cells onto the first or second bit lines, and the controller retains the read data in the register through the data line, thereafter selects one of the line word lines and writes the data retained in the register into one of the line memory cells.

* * * * *